US012413207B2

(12) United States Patent
Shin et al.

(10) Patent No.: US 12,413,207 B2
(45) Date of Patent: Sep. 9, 2025

(54) PASSBAND FILTER COMBINING RESONATORS OF A FIRST TYPE AND RESONATORS OF A SECOND TYPE

(71) Applicant: SKYWORKS GLOBAL PTE. LTD., Singapore (SG)

(72) Inventors: Kwang Jae Shin, Yongin (KR); Alexandre Augusto Shirakawa, Cardiff by the Sea, CA (US); Yiliu Wang, Irvine, CA (US); Tetsuya Tsurunari, Hirakata (JP); Nobufumi Matsuo, Suita (JP)

(73) Assignee: SKYWORKS GLOBAL PTE. LTD., Singapore (SG)

(*) Notice: Subject to any disclaimer, the term of this patent is extended or adjusted under 35 U.S.C. 154(b) by 432 days.

(21) Appl. No.: 17/951,643

(22) Filed: Sep. 23, 2022

(65) Prior Publication Data
US 2023/0098495 A1 Mar. 30, 2023

Related U.S. Application Data

(60) Provisional application No. 63/249,358, filed on Sep. 28, 2021.

(51) Int. Cl.
H03H 9/02 (2006.01)
H03H 9/10 (2006.01)
H03H 9/17 (2006.01)
H03H 9/60 (2006.01)
H04B 1/40 (2015.01)

(52) U.S. Cl.
CPC ........ *H03H 9/605* (2013.01); *H03H 9/02228* (2013.01); *H03H 9/171* (2013.01); *H04B 1/40* (2013.01)

(58) Field of Classification Search
None
See application file for complete search history.

(56) References Cited

U.S. PATENT DOCUMENTS

| 8,489,666 | B1* | 7/2013 | Nikitin | H03G 5/18 708/819 |
| 10,873,317 | B2* | 12/2020 | Shen | H03H 9/54 |
| 2008/0007369 | A1 | 1/2008 | Barber et al. | |
| 2009/0045703 | A1 | 2/2009 | Barber et al. | |
| 2012/0293277 | A1* | 11/2012 | Hara | H03H 9/132 333/133 |
| 2019/0273480 | A1* | 9/2019 | Lin | H03H 9/02031 |

(Continued)

FOREIGN PATENT DOCUMENTS

| CN | 110071703 A | * | 7/2019 | ........ H01P 1/20 |
| CN | 110739930 A | * | 1/2020 | ........ H03H 1/0007 |

(Continued)

*Primary Examiner* — Mohammed Rachedine
(74) *Attorney, Agent, or Firm* — Lando & Anastasi, LLP

(57) ABSTRACT

According to the present disclosure, a passband filter is provided. The passband filter comprises a first connection, a second connection, and a third connection. One or more resonators of a first type are provided connected in series between the first connection and the second connection; and one or more resonators of a second type are provided connected from between the first connection and the second connection to the third connection. A radio-frequency front end module and wireless mobile device are also provided.

17 Claims, 12 Drawing Sheets

(56) References Cited

U.S. PATENT DOCUMENTS

| | | | |
|---|---|---|---|
| 2020/0274520 A1* | 8/2020 | Shin | H03H 9/02125 |
| 2020/0373911 A1 | 11/2020 | Wang et al. | |
| 2021/0028765 A1 | 1/2021 | Wang et al. | |
| 2022/0247382 A1* | 8/2022 | Dyer | H03H 9/542 |

FOREIGN PATENT DOCUMENTS

| | | | |
|---|---|---|---|
| DE | 102016120337 A1 * | 4/2017 | H03H 9/0576 |
| WO | 2019169025 A1 | 9/2019 | |
| WO | WO-2022014496 A1 * | 1/2022 | H03H 9/02031 |

* cited by examiner

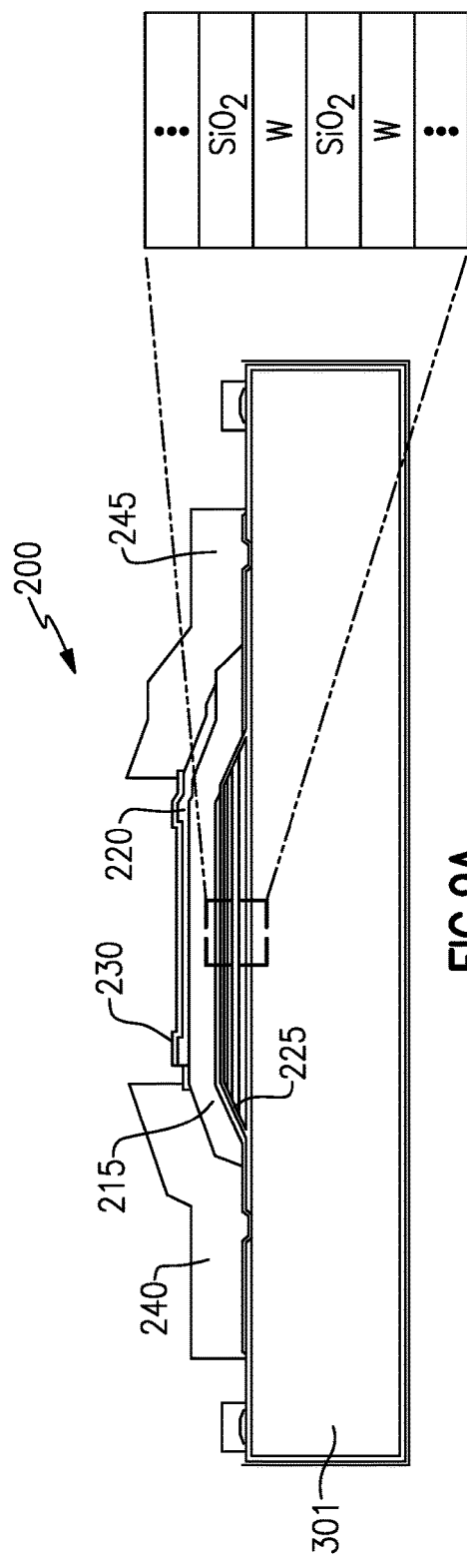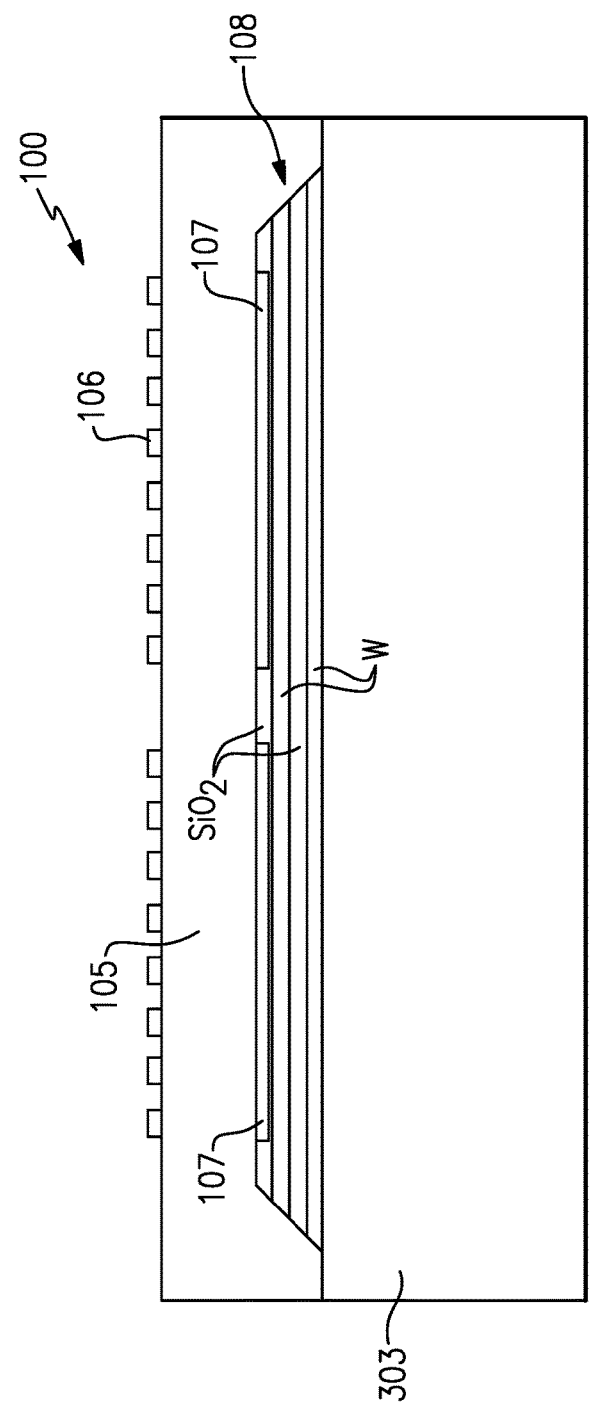

PASSBAND FILTER COMBINING RESONATORS OF A FIRST TYPE AND RESONATORS OF A SECOND TYPE

CROSS-REFERENCE TO RELATED APPLICATIONS

This application claims priority under 35 U.S.C. § 119(e) to U.S. Provisional Patent Application Ser. No. 63/249,358, titled "PASSBAND FILTER COMBINING RESONATORS OF A FIRST TYPE AND RESONATORS OF A SECOND TYPE," filed Sep. 28, 2021, the entire contents of which is incorporated herein by reference for all purposes.

BACKGROUND

Field

Aspects and embodiments disclosed herein relate to passband filters, such as for use in radio-frequency front end (RFFE) modules. Aspects and embodiments disclosed herein also relate to radio-frequency (RF) modules and wireless devices comprising passband filters.

Description of the Related Technology

Acoustic wave devices may be utilized as components of filters in radio frequency electronic systems. For instance, filters in a radio frequency front end of a mobile phone can include acoustic wave filters. Filters include passband filters. The acoustic wave devices that comprise a filter affect its performance and the range of frequencies in which it can operate.

A type of acoustic wave device commonly used in passband filters is a film bulk acoustic wave resonator (FBAR). This type of resonator has a simple and robust structure and is formed using a well-known, simple process. FBARs have a clean frequency response at their upper frequencies, but not at their lower frequencies, which can affect the quality of passband filters into which they are incorporated.

With the advent of 5G New Radio (5G NR), new frequency ranges have been opened up for use, including Frequency Range 1 (FR1) between approximately 0.4 and 7.1 GHz. New filters are desired that are adapted to work at these frequency ranges, as well as filters that produce a cleaner, better quality signal.

SUMMARY

According to one embodiment there is provided a passband filter comprising a first connection, a second connection, a third connection, one or more resonators of a first type connected in series between the first connection and the second connection, and one or more resonators of a second type connected from between the first connection and the second connection to the third connection.

In one example, each of the one or more resonators of the second type are connected in parallel from the first connection and the second connection to the third connection.

In one example, one of the one or more resonators of the second type is connected to the third connection from between each of the one or more resonators of the first type connected in series.

In one example, the passband filter comprises n resonators of the second type and n+1 resonators of the first type.

In one example, the third connection is a ground connection.

In one example, each of the resonators of the first type have a smooth frequency response below a resonant frequency of the resonator. A smooth frequency response may be a frequency response without spurious modes below the resonant frequency.

In one example, the resonators of the first type are Lamb wave resonators.

In one example, each of the resonators of the second type have a smooth frequency response above a resonant frequency of the resonator. A smooth frequency response may be a frequency response without spurious modes above the resonant frequency.

In one example, the resonators of the second type are film bulk acoustic wave resonators.

In one example, the passband filter further comprises a first substrate, the one or more resonators of the first type being disposed on the first substrate, and a second substrate, the one or more resonators of the second type being disposed on the second substrate.

In one example, the first substrate has a first surface, the one or more resonators of the first type being disposed on the first surface. The second substrate may have a second surface, the one or more resonators of the second type being disposed on the second surface. The first substrate and the second substrate may be arranged such that the first surface faces the second surface.

In one example, the passband filter is made by forming the one or more resonators of the first type on the first substrate, forming the one or more resonators of the second type on the second substrate, and subsequently either mounting the first substrate onto the second substrate or mounting the second substrate onto the first substrate.

In one example, one or both of the first substrate and the second substrate are silicon wafers.

In one example, the one or more resonators of the first type each have a piezoelectric layer of a first material and the one or more resonators of the second type each have a piezoelectric layer of a second material, the second material being different from the first material.

In one example, the first material is lithium niobate or lithium tantalate.

In one example, the second material is aluminum nitride.

According to another embodiment there is provided a radio-frequency module comprising a packaging substrate configured to receive a plurality of devices, and a die mounted on the packaging substrate, the die having a passband filter having a first connection, a second connection, a third connection, one or more resonators of a first type connected in series between the first connection and the second connection, and one or more resonators of a second type connected from between the first connection and the second connection to the third connection.

According to another embodiment there is provided a wireless mobile device comprising one or more antennas, and a radio-frequency module that communicates with the one or more antennas, the radio-frequency module having a die including a passband filter having a first connection, a second connection, a third connection, one or more resonators of a first type connected in series between the first connection and the second connection, and one or more resonators of a second type connected from between the first connection and the second connection to the third connection.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 9A is a BAW resonator comprising Bragg reflectors;
FIG. 9B is a Lamb wave resonator comprising Bragg reflectors.

DETAILED DESCRIPTION

Aspects and embodiments described herein are directed to a passband filter, such as for use in radio-frequency (RF) and radio-frequency front end (RFFE) modules, having an improved frequency response and able to operate at higher frequencies, having better power handling and wide band application with a higher $k_t^2$ than conventional passband filters.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
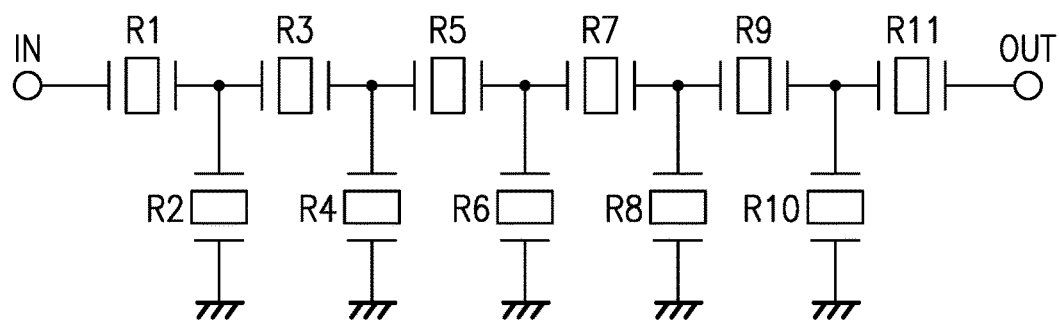
FIG. 1A is a known passband filter.

Film bulk acoustic wave resonators (FBARs) may be combined to form a filter structure that may operate in the radio frequency (RF) band. One type of a FBAR-based RF filter is known as a ladder filter. One example of a ladder filter is illustrated in FIG. 1A. The filter of FIG. 1A includes a plurality of FBARs R1, R2, R3, R4, R5, R6, R7, R8, R9, R10, and R11. Resonators R1, R3, R5, R7, R9, and R11 are connected in series between the input port (IN) and the output port (OUT). Resonators R2, R4, R6, R8, and R10 are connected between adjacent pairs of resonators R1, R3, R5, R7, R9, and R11 and ground. Resonators R2, R4, R6, R8, and R10 may also be referred to as shunt resonators. In some embodiments, each of the series resonators R1, R3, R5, R7, R9, and R11 may have the same resonant frequency. Each of the plurality of shunt resonators R2, R4, R6, R8, and R10 have a resonant frequency below the resonant frequency of each of the series arm resonators R1, R3, R5, R7, R9, and R11. At least one of the plurality of shunt resonators R2, R4, R6, R8, and R10 may have a first resonant frequency different from resonant frequencies of others of the plurality of shunt resonators. At least one of the plurality of shunt resonators R2, R4, R6, R8, and R10 may have a second resonant frequency different from the first resonant frequency and different from the resonant frequencies of others of the plurality of shunt resonators.

Figure 1B:
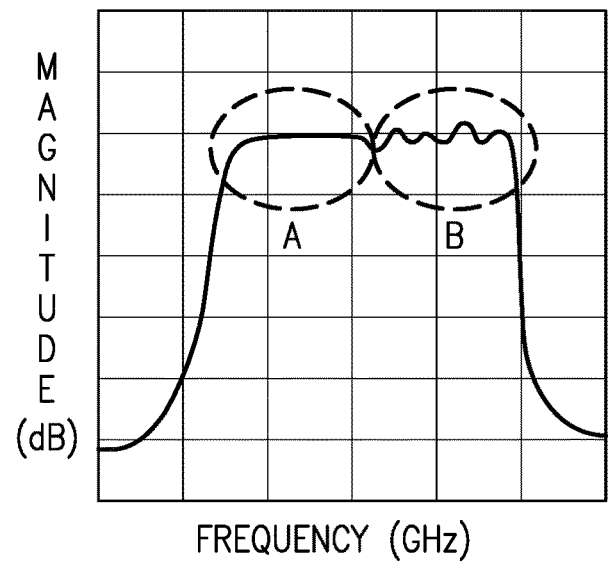
FIG. 1B is a frequency response of a known passband filter.

The filter of FIG. 1A acts as a passband filter, often provided in radio-frequency front end (RFFE) modules. Such a passband filter has a frequency response as illustrated in FIG. 1B. The filter allows a range of frequencies through, with signals having frequencies outside of this range being suppressed. The series resonators R1, R3, R5, R7, R9, and R11 define the upper frequency limit of the passband filter, while the shunt resonators R2, R4, R6, R8, and R10 define the lower frequency limit. However, within the passband range, while a first region A has a clean frequency response, a second region B does not. This region comprises spurious peaks and troughs, affecting the quality of the passband filter in this range of frequencies. The reason for this will be discussed with relation to FIGS. 2A and 2B.

Figure 2A:
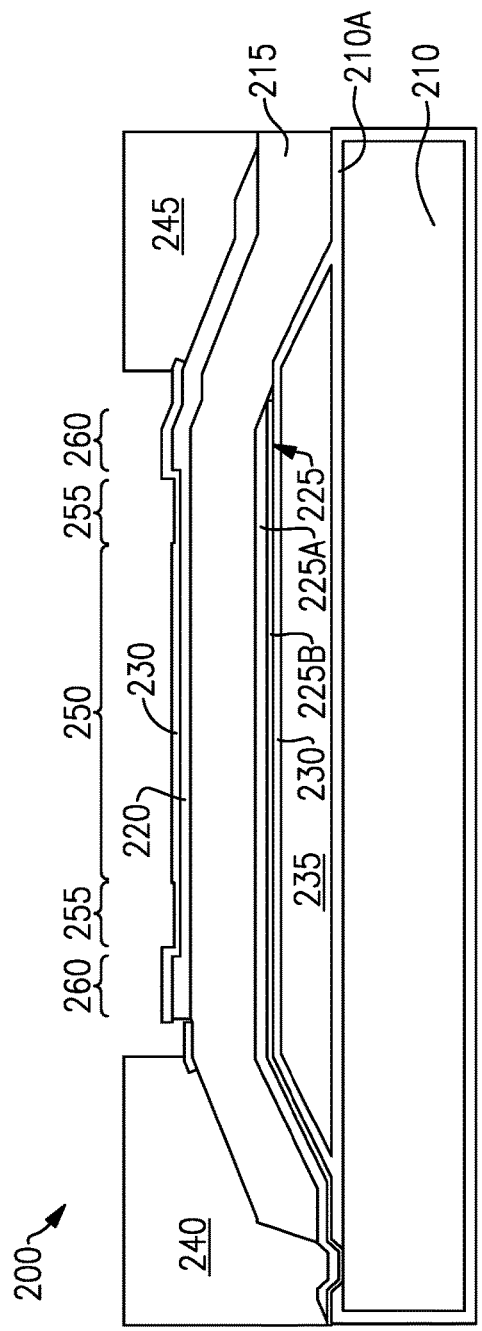
FIG. 2A is a BAW resonator.

FIG. 2A is cross-sectional view of an example of an FBAR, indicated generally at 200. The FBAR 200 is disposed on a substrate 210, for example, a silicon substrate that may include a dielectric surface layer 210A of, for example, silicon dioxide. The FBAR 200 includes a layer or film of piezoelectric material 215, for example, aluminum nitride (AlN). A top electrode 220 is disposed on top of a portion of the layer or film of piezoelectric material 215 and a bottom electrode 225 is disposed on the bottom of a portion of the layer or film of piezoelectric material 215. The top electrode 220 may be formed of, for example, ruthenium (Ru). The bottom electrode 225 may include a layer 225A of Ru disposed in contact with the bottom of the portion of the layer or film of piezoelectric material 215 and a layer 225B of titanium (Ti) disposed on a lower side of the layer 225A of Ru opposite a side of the layer 225A of Ru in contact with the bottom of the portion of the layer or film of piezoelectric material 215. Each of the top electrode 220 and the bottom electrode 225 may be covered with a layer of dielectric material 230, for example, silicon dioxide. An air cavity 235 is defined beneath the layer of dielectric material 230 covering the bottom electrode 225 and the surface layer 210A of the substrate 210. A bottom electrical contact 240 formed of, for example, copper may make electrical connection with the bottom electrode 225 and a top electrical contact 245 formed of, for example, copper may make electrical connection with the top electrode 220.

The FBAR 200 may include a central region 250 including a main active domain in the layer or film of piezoelectric material 215 in which a main acoustic wave is excited during operation. A recessed frame region or regions 255 may bound and define the lateral extent of the central region 250. The recessed frame region(s) 255 may be defined by areas that have a thinner layer of dielectric material 230 on top of the top electrode 220 than in the central region 250. The dielectric material layer 230 in the recessed frame region(s) 255 may be from about 10 nm to about 200 nm thinner than the dielectric material layer 230 in the central region 250 and/or the difference in thickness of the dielectric material in the recessed frame region(s) 255 vs. in the central region 250 may cause the resonant frequency of the device in the recessed frame region(s) 255 to be between about 5 MHz to about 50 MHz higher than the resonant frequency of the device in the central region 250. A raised frame region or regions 260 may be defined on an opposite side of the recessed frame region(s) 255 from the central region 250 and may directly abut the outside edge(s) of the recessed frame region(s) 255. The raised frame region(s) 260 may be defined by areas where the top electrode 220 is thicker than in the central region 250 and in the recessed frame region(s) 255. The top electrode 220 may have the same thickness in the central region 250 and in the recessed frame region(s) 255 but a greater thickness in the raised frame region(s) 260. The top electrode 220 may be between about 50 nm and about 500 nm thicker in the raised frame region(s) 260 than in the central region 250 and/or in the recessed frame region(s) 255. The raised frame region(s) may be, for example, 4 μm or more in width.

The recessed frame region(s) 255 and the raised frame region(s) 260 may contribute to dissipation or scattering of transverse acoustic waves generated in the FBAR 200 during operation and/or may reflect transverse waves propagating outside of the recessed frame region(s) 255 and the raised frame region(s) 260 and prevent these transverse acoustic waves from entering the central region and inducing spurious signals in the main active domain region of the FBAR. Without being bound to a particular theory, it is believed that due to the thinner layer of dielectric material 230 on top of the top electrode 220 in the recessed frame region(s) 255, the recessed frame region(s) 255 may exhibit a higher velocity of propagation of acoustic waves than the central region 250. Conversely, due to the increased thickness and mass of the top electrode 220 in the raised frame region(s) 260, the raised frame regions(s) 260 may exhibit a lower velocity of propagation of acoustic waves than the central region 250 and a lower velocity of propagation of acoustic waves than the recessed frame region(s) 255. The discontinuity in acoustic wave velocity between the recessed frame region(s) 255 and the raised frame region(s) 260 creates a barrier that scatters, suppresses, and/or reflects transverse acoustic waves.

Figure 2B:
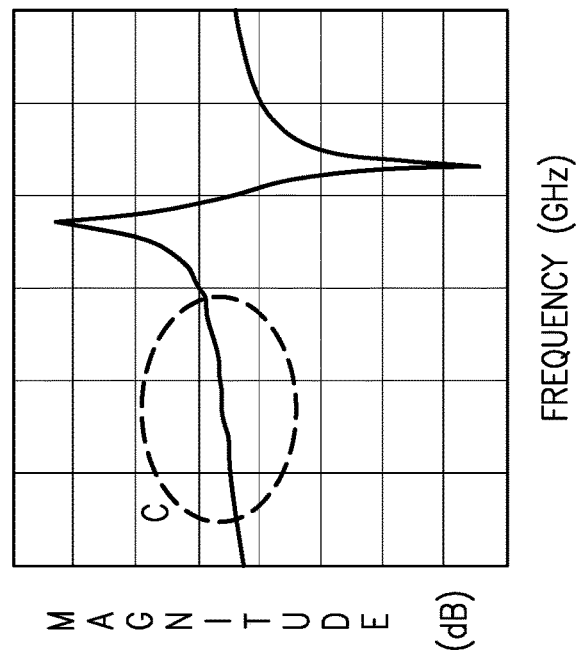
FIG. 2B is a frequency response of a BAW resonator.

FIG. 2B illustrates the frequency response of a typical FBAR, such as the FBAR described with respect to FIG. 2A.

It can be seen in FIG. 2B that the FBAR displays a resonance and an anti-resonance at nearby frequencies. Above the resonant and anti-resonant peaks, the frequency response of the FBAR is smooth. However, this is not the case below the resonant and anti-resonant peaks, in region C. Here, spurious peaks are present and a FBAR operating in this frequency (i.e., below its resonant frequency) will operate at a reduced efficiency compared to operation above the resonant frequency. Because of the spurious peaks below the resonant frequency, in region C, when used as the series resonators in a passband filter, such as that illustrated in FIG. 1A, the upper passband frequency ranges do not provide a smooth frequency response, leading to the region B of spurious peaks and troughs illustrated in FIG. 1B.

According to the present disclosure, a passband filter is provided comprising resonators of a first type and resonators of a second type. The resonators of the second type may be FBARs. The resonators of the first type may be Lamb wave resonators. A Lamb wave resonator is also a type of bulk acoustic wave resonator. Lamb wave resonators can operate at higher frequency than FBARs, because they typically do not use only a thin film of piezoelectric material, and they can handle higher powers. Furthermore, they have a higher $k_t^2$ than FBARs where $k_t^2$ is the electromagnetic coupling factor in relation to the longitudinal vibration mode that is employed by FBAR and Lamb wave resonators. However, Lamb wave resonators are a more complex design to manufacture than FBARs using current manufacturing processes.

Figure 3A:
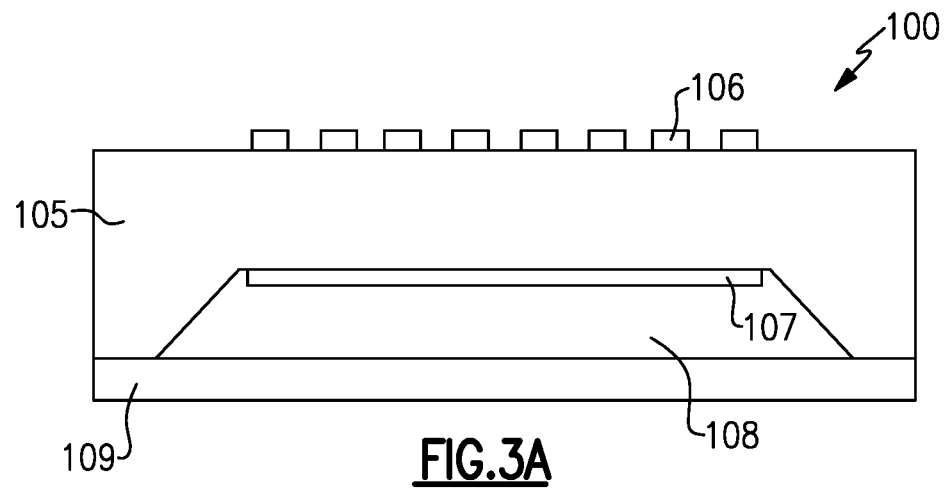
FIG. 3A is a Lamb wave resonator.

FIG. 3A is a cross-sectional diagram of a Lamb wave resonator 100. The Lamb wave resonator 100 is implemented on a substrate 109. The Lamb wave device 100 includes a piezoelectric layer 105, an interdigital transducer electrode (IDT) electrode 106 on the piezoelectric layer 105, and an electrode 107. The piezoelectric layer 105 can be a thin film. The piezoelectric layer 105 can be an aluminum nitride (AlN) layer. In other instances, the piezoelectric layer 105 can be any suitable piezoelectric layer. For example, the piezoelectric layer 105 can be a lithium niobate layer ($LiNbO_3$) or a lithium tantalate ($LiTaO_3$) layer. The frequency of the Lamb wave resonator 100 can be based on the geometry of the IDT electrode 106. In some instances, the illustrated IDTs of the Lamb wave resonator 100 represent two sets of IDTs. The electrode 107 can be grounded in certain instances. In some other instances, the electrode 107 can be floating. An air cavity 108 is disposed between the electrode 107 and a substrate 109. Any suitable cavity can be implemented in place of the air cavity 108. The substrate 109 can be a semiconductor substrate. For example, the substrate 109 can be a silicon substrate. The substrate 109 can be any other suitable substrate, such as a quartz substrate, a sapphire substrate, or a spinel substrate.

Figure 3B:
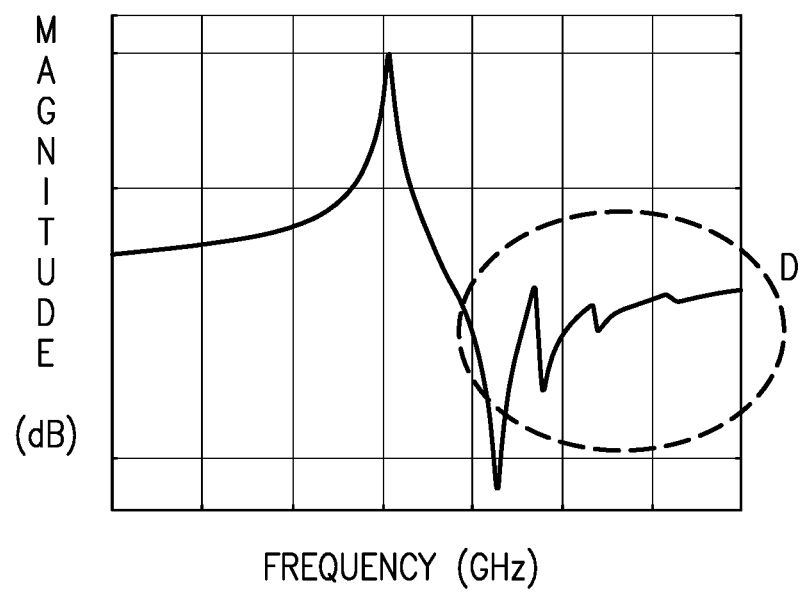
FIG. 3B is a frequency response of a Lamb wave resonator.

FIG. 3B illustrates the frequency response of a Lamb wave resonator, such as Lamb wave resonator 100 illustrated in FIG. 3A. It can be seen in FIG. 3B that the Lamb wave resonator displays a resonance and an anti-resonance at nearby frequencies. Typically, Lamb wave resonators have higher resonant frequencies than FBARs. Below the resonant and anti-resonant peaks, the frequency response of the Lamb wave resonator is smooth. However, this is not the case above the resonant and anti-resonant peaks, in region D. Here, spurious peaks are present and a Lamb wave resonator operating in this frequency (i.e., above its resonant frequency) will operate at a reduced efficiency compared to operation below the resonant frequency.

Figure 4A:
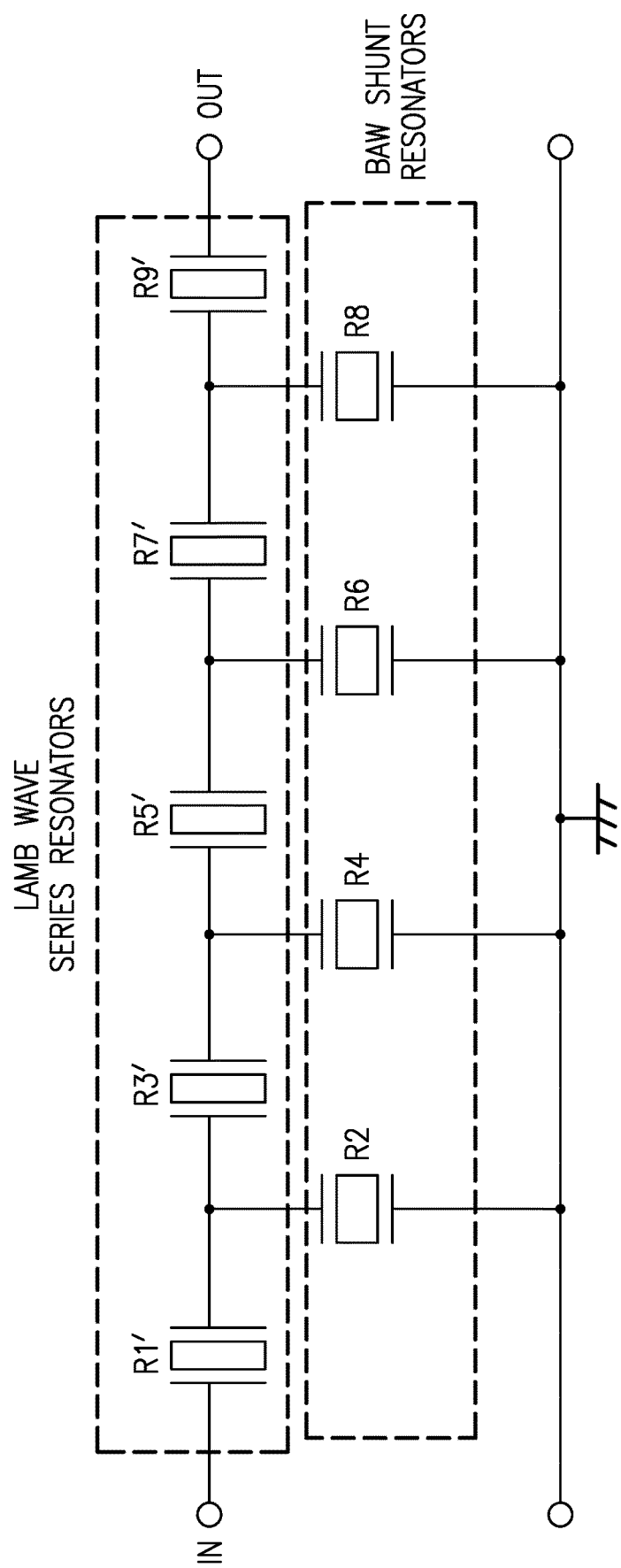
FIG. 4A is a passband filter according to aspects disclosed herein.

FIG. 4A illustrates a passband filter according to the present disclosure, comprising FBARs and Lamb wave resonators. The shunt resonators R2, R4, R6, and R8 are FBARs, as described in FIG. 1A. In FIG. 4A, the shunt resonators R2, R4, R6, and R8 are connected to ground, though in other examples they may be connected to one or more different voltages. Unlike the passband filter of FIG. 1A, however, the series resonators R1', R3', R5', R7', and R9' of FIG. 4 are Lamb wave resonators. The series resonators R1', R3', R5', R7', and R9' are connected in a series arm between an input port or first connection (IN) and an output port or second connection (OUT). Resonators R2, R4, R6, R8, and R10 are connected between adjacent pairs of resonators R1', R3', R5', R7', and R9' and ground. In some embodiments, each of the series resonators R1', R3', R5', R7', and R9' may have the same resonant frequency. Each of the plurality of shunt resonators R2, R4, R6, and R8 have a resonant frequency below the resonant frequency of each of the series arm resonators R1', R3', R5', R7', and R9'. This may be achieved due to the fact that, as noted above, Lamb wave resonators typically have a higher resonant frequency to FBARs. At least one of the plurality of shunt resonators R2, R4, R6, and R8 may have a first resonant frequency different from resonant frequencies of others of the plurality of shunt resonators. At least one of the plurality of shunt resonators R2, R4, R6, and R8 may have a second resonant frequency different from the first resonant frequency and different from the resonant frequencies of others of the plurality of shunt resonators.

Figure 4B:
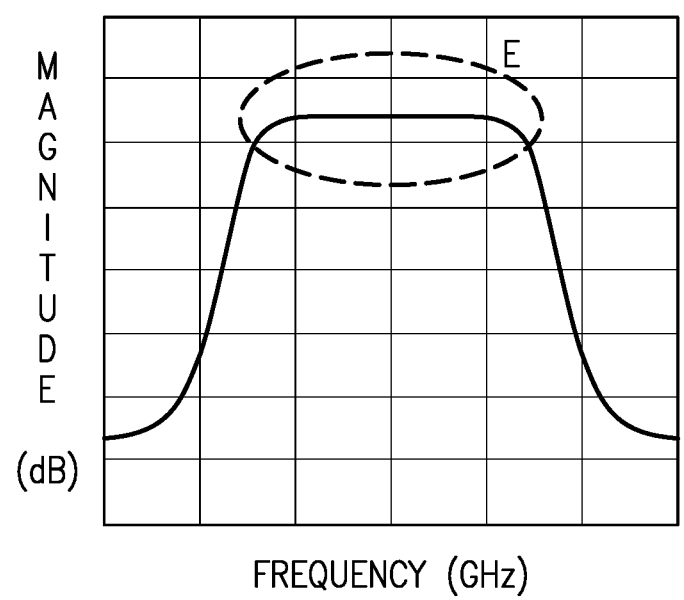
FIG. 4B is a frequency response according to a passband filter according to aspects disclosed herein.

Arranging the Lamb wave resonators R1', R3', R5', R7', and R9' and the FBARs R2, R4, R6, and R8 in this manner provides a passband filter with a smooth frequency response across the passband range, as illustrated in FIG. 4B. Because the Lamb wave resonators are used as the series resonators determining the upper range of the passband, and have a smooth frequency response below their resonant frequency as illustrated in FIG. 3B, and because the FBARs are used as the shunt resonators determining the lower range of the passband, and have a smooth frequency response above their resonant frequency as illustrated in FIG. 2B, the passband filter of FIG. 4A has the smooth frequency response shown in FIG. 4B, improving the quality of the passband filter.

As well as having a smoother frequency response across the passband frequency range, as shown in FIG. 4B, a passband filter of the present disclosure, such as that of FIG. 4A, can operate at higher frequencies due to the use of the Lamb mode resonators. The use of Lamb resonators also enables the passband filter to be employed in higher power applications. One reason for these benefits is that during operation a passband filter heats up leading to thermal expansion of the component resonators. This lowers their operating frequencies. The series resonators, being responsible for the higher frequency end of the passband, are more prone to this effect and so by using Lamb wave resonators, which have better power handling capabilities than FBARs (e.g., due to thicker piezoelectric layers), as the series resonators, the power handling of the whole passband filter can be greatly improved. Furthermore, by selecting appropriate frequency resonators, including using FBARs in overtone modes as discussed with relation to FIGS. 6-8, the passband filter can also be used for wide band applications, with a high $k_t^2$.

Figure 5:
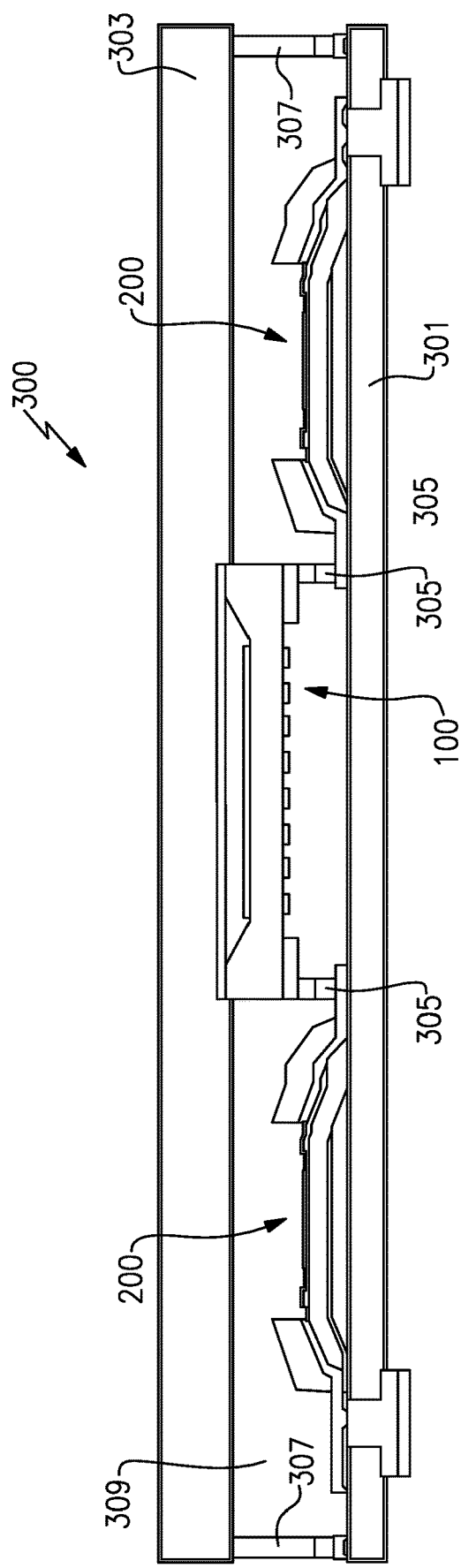
FIG. 5 is a cross section of a passband filter according to aspects disclosed herein.

A cross section of a passband filter according to the present disclosure, such as the passband filter of FIG. 4A, is illustrated in FIG. 5. The passband filter 300 comprises a number of series Lamb resonators 100 and a number of shunt FBARs 200, with two FBARs 200 being visible and one Lamb resonator 100 being visible in FIG. 5. The passband filter is housed within a cavity 309 formed by a first substrate 301 and a second substrate 303, which are bonded via pillars 307. The first substrate 301 and the second substrate 303 may be silicon wafers, and are preferably each planar and substantially parallel to one another.

The pillars 307 form a hermetic seal between the first substrate 301 and the second substrate 303, ensuring that the Lamb wave resonators 100 and the FBARs 200 are provided within a hermetically sealed environment. Housing the Lamb wave resonators 100 and the FBARs 200 in a hermetically sealed environment prevents moisture or other environmental effects from affecting the Lamb wave resonators 100 and the FBARs 200, in particular ensuring that their frequencies do not change, increasing the quality of the device.

Within the cavity 309, the FBARs 200 are disposed upon the first substrate 301. In particular, they are disposed upon an internal surface of the first substrate 301, the internal surface being the surface presenting within the cavity 309. Meanwhile, the Lamb wave resonators 100 are disposed upon the second substrate 303. Again, they are disposed upon an internal surface of the second substrate 303, the internal surface being the surface presenting within the cavity 309. It will be appreciated that the internal surfaces of the first substrate 301 and the second substrate 303 face one another, and accordingly the Lamb wave resonators 100 and the FBARs 200 can be connected by connections 305 in the configuration illustrated in FIG. 4A.

Existing passband filters position the series and shunt resonators on the same substrate. However, by positioning the Lamb wave resonators 100 and the FBARs 200 on different substrates, the passband filters of the present disclosure can be manufactured using different piezoelectric materials and processes using existing techniques, and then combined into the required layout (e.g., the passband filter of FIG. 4A) using existing chip packaging technologies. Given that Lamb wave resonators and FBARs preferably comprise different piezoelectric materials, this provides a simplified way to incorporate the Lamb wave resonators and FBARs together in the passband filter. Furthermore, it enables more flexibility to be incorporated into the manufacturing process, as the Lamb wave resonators and/or FBARs can easily be switched for replacements of a different frequency (or having any other modified feature or property) simply by combining different substrates having the different Lamb wave resonators and FBARs, rather than having to modify an entire process.

The passband filters of FIGS. 4A and 5 have been illustrated as comprising a specific number of series (Lamb wave) and shunt (FBAR) resonators. However, it will be appreciated that different numbers of resonators may be used depending upon the desired application and properties of the passband filter. For example, two Lamb wave resonators may be provided as the series resonators, and a single FBAR may be provided as a shunt resonator.

The passband filters of FIGS. 4A and 5 have also been described as comprising a number of the FBARs illustrated in FIG. 2A. However, variations on the FBARs that can be used with the invention are possible. One possible variation will be described with respect to FIGS. 6-8.

Figure 6:
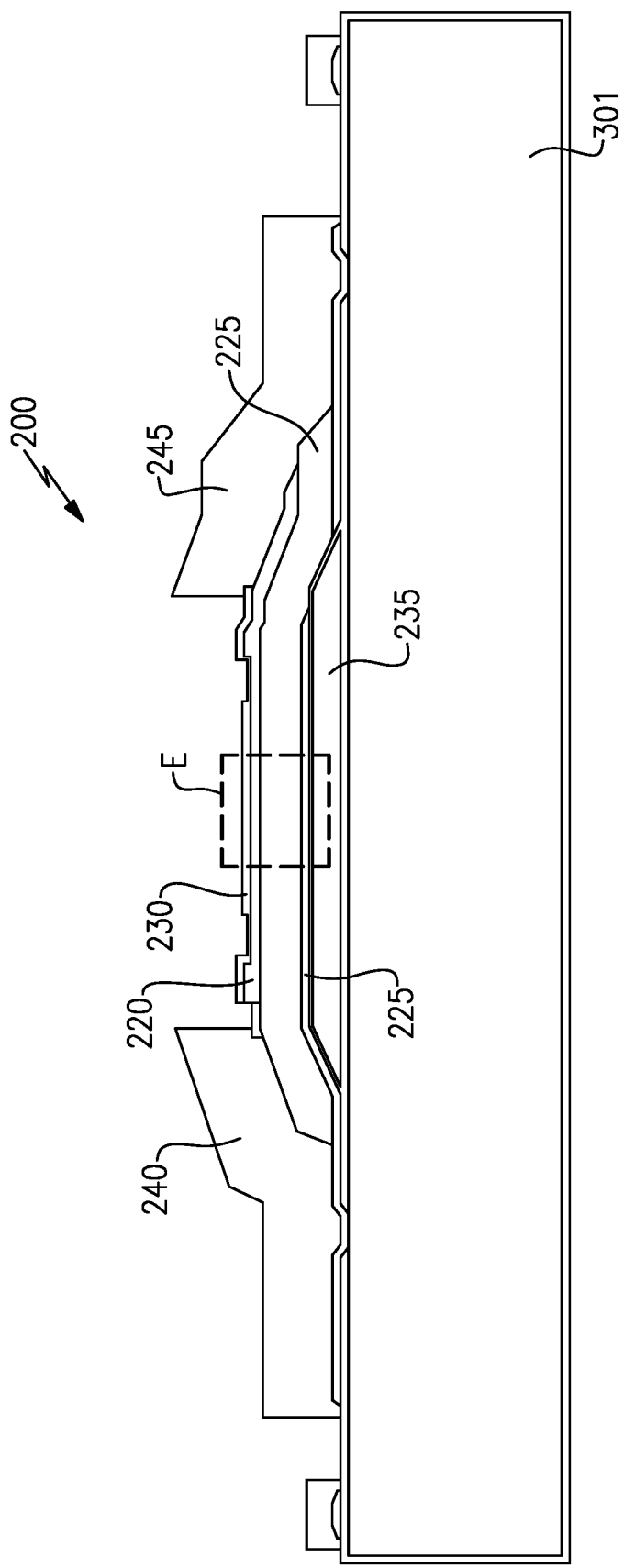
FIG. 6 is a BAW resonator.

Turning to FIG. 6, this figure illustrates an FBAR 200. The FBAR 200 is generally the same as that discussed in relation to FIG. 2A, and is mounted on a substrate 301, such as a silicon wafer, and comprises a top electrode 220 and a bottom electrode 225 disposed either side of piezoelectric layer 215. The FBAR further comprises a cavity 235, and has a layer of dielectric material 230 disposed over the top electrode 220. The difference of the FBAR 200 of FIG. 6 compared to that of FIG. 2A will be discussed in relation to FIGS. 7 and 8.

Figure 7A:
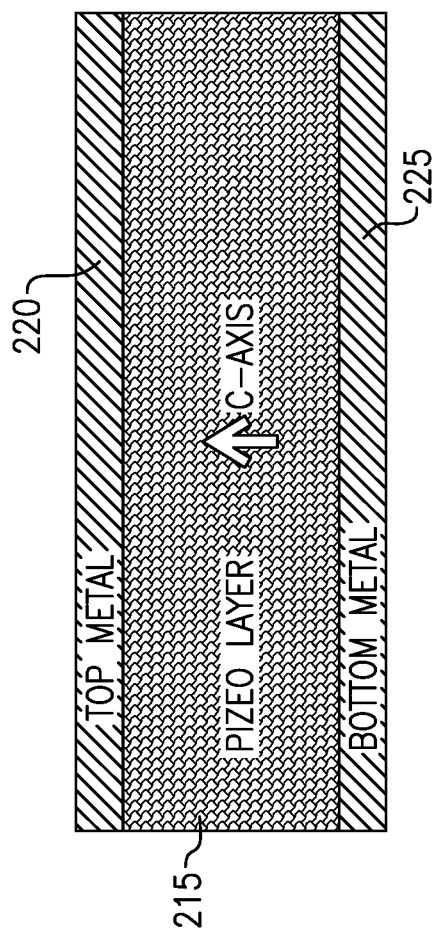
FIG. 7A is a first mode of operation of a BAW resonator.
Figure 7B:
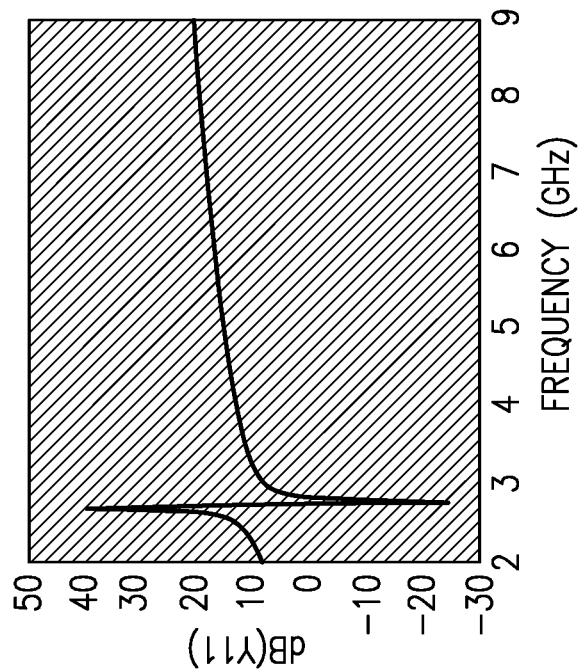
FIG. 7B is the frequency response of the first mode of operation of a BAW resonator.

FIG. 7A illustrates the region of box E in FIG. 6 in a conventional FBAR of FIG. 2A. It comprises a single piezoelectric layer 215, bounded by a top electrode 220 and a bottom electrode 225. FIG. 7B illustrates the frequency response of such a device. The y-axis of FIG. 7B presents the admittance of the 1-port resonator, while the x-axis represents frequency. As can be seen, the resonant frequency lies between 2 GHz and 3 GHz (for the selected thickness of the piezoelectric layer 215). Such a mode of operation is known as a thickness extension (TE) mode.

Figure 8B:
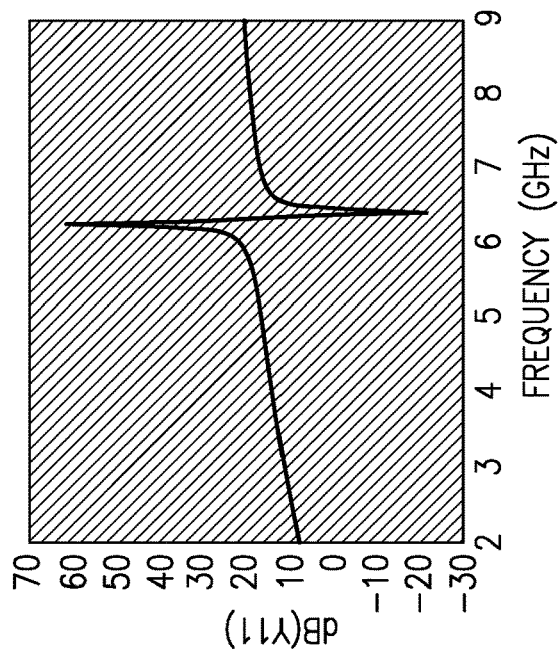
FIG. 8B is the frequency response of the second mode of operation of a BAW resonator.
Figure 8A:
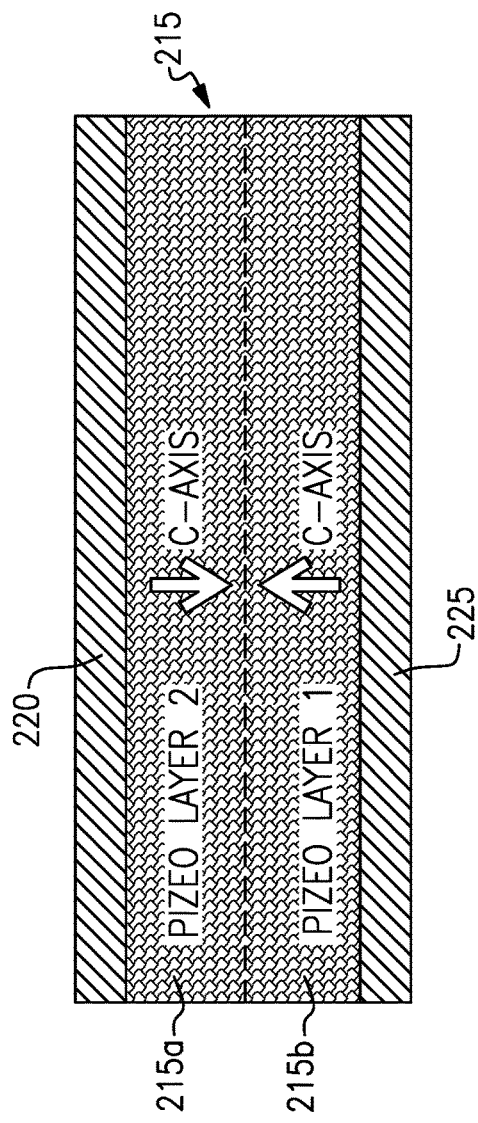
FIG. 8A is a second mode of operation of a BAW resonator.

FIG. 8A, on the other hand, illustrates a variation whereby the piezoelectric layer 215 is divided into two sub-layers 215a, 215b. The layers are distinguished by having different polarizations, as illustrated in the example of FIG. 8B wherein the piezoelectric layers are AlN layers having different orientations of the C-axis, the glide plane in the c-direction to the normal of the crystal structure, in each sub-layer 215a, 215b. Looking at the graph of FIG. 8B, the effect of dividing the piezoelectric layer 215 into two sub-layers 215a, 215b is apparent. The resonant frequency, for the same total thickness of the piezoelectric layer 215, is greatly increased, now lying between 6 GHz and 7 GHz. Such a mode of operation is known as an overtone mode. In this manner, by utilizing the overtone mode by having two (or more) layers of piezoelectric material with different polarizations, an FBAR device can be provided to operate in a range of desired frequencies.

Furthermore, while the FBARs (e.g., FIG. 2A) and Lamb wave resonators (e.g., FIG. 3A) described herein have been taught as comprising an air cavity, the cavities may in fact not be air cavities but may comprise another material or materials. FIGS. 9A and 9B illustrate devices having cavities with alternating layers of silicon dioxide (Si) and tungsten (W). The alternating Si and W layers are known as Bragg reflectors, and function as an acoustic mirror. It will be appreciated that other types of Bragg reflectors can be implemented, as can other suitable acoustic mirrors in place of the Bragg reflectors. FIG. 9A illustrates a FBAR 200 comprising Bragg reflectors, while FIG. 9B illustrates a Lamb wave resonator 100 comprising Bragg reflectors.

The piezoelectric layers of the acoustic devices described herein may have been described with respect to a specific example, though it will be appreciated that other compositions of piezoelectric layer may be used. The required piezoelectric material will be based upon, amongst other considerations, the desired frequency range of operation of the acoustic device. A non-exhaustive list of possible piezoelectric materials includes aluminum nitride (AlN) and aluminum nitride doped with one or more of scandium (Sc), yttrium (Y), hafnium (Hf), magnesium (Mg), tantalum (Ta); zinc oxide (ZnO); lithium niobate ($LiNbO_3$); lithium tantalate ($LiTaO_3$); lead titanate ($PbTiO_3$); and zirconium titanate ($ZrTiO_3$). BAW resonators typically use an aluminum nitride piezoelectric layer. Lamb wave resonators preferably comprise a zinc oxide, lithium niobate or lithium tantalate piezoelectric layer, which provide for good lateral vibration speeds and a high $k_t^2$, making the Lamb wave resonators good for high frequency applications. Other suitable materials and dopants may also be used.

Figure 10:
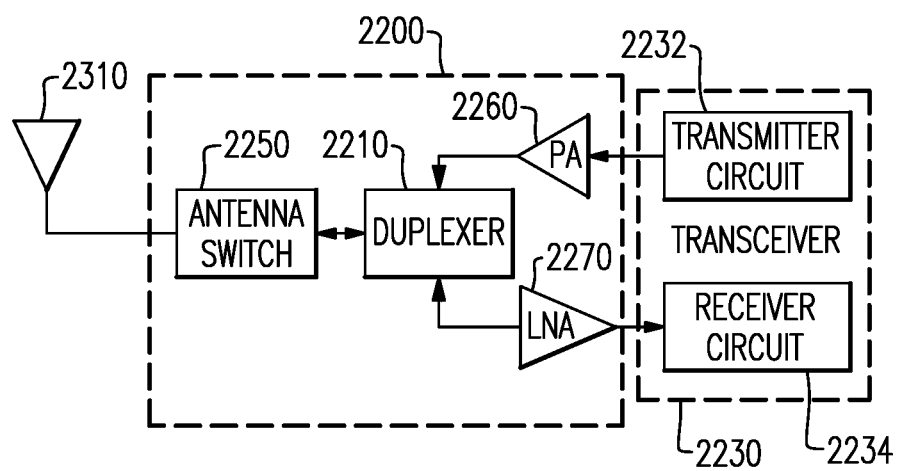
FIG. 10 is a schematic of a radio frequency front end module incorporating aspects disclosed herein.

The passband filters described herein in accordance with the present invention may be incorporated into a radio-frequency front end (RFFE) module. An exemplary RFFE module is shown in FIG. 10. This figure illustrates a front end module 2200, connected between an antenna 2310 and a transceiver 2230. The front end module 2200 includes a duplexer 2210 in communication with an antenna switch 2250, which itself is in communication with the antenna 2310.

As illustrated, the transceiver 2230 comprises a transmitter circuit 2232. Signals generated for transmission by the transmitter circuit 2232 are received by a power amplifier (PA) module 2260 within the front end module 220 which amplifies the generated signals from the transceiver 2230. The PA module 2260 can include one or more PAs. The PA module 2260 can be used to amplify a wide variety of RF or other frequency-band transmission signals. For example, the PA module 2260 can receive an enable signal that can be used to pulse the output of the PE to aid in transmitting a wireless local area network (WLAN) signal or any other suitable pulsed signal. The PA module 2260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the PA module 2260 and associated components including switches and the like can be fabricated on gallium arsenide (GaAs) substrates using, for example, high electron mobility transistors (pHEMT) or insulated-gate bipolar transistors (BiFET), or on a silicon substrate using complementary metal-oxide semiconductor (CMOS) field effect transistors (FETs).

Still referring to FIG. 10, the front end module 2200 may further include a low noise amplifier (LNA) module 2270, which amplifies received signals from the antenna 2310 and provides the amplified signals to the receiver circuit 2234 of the transceiver 2230.

Figure 11:
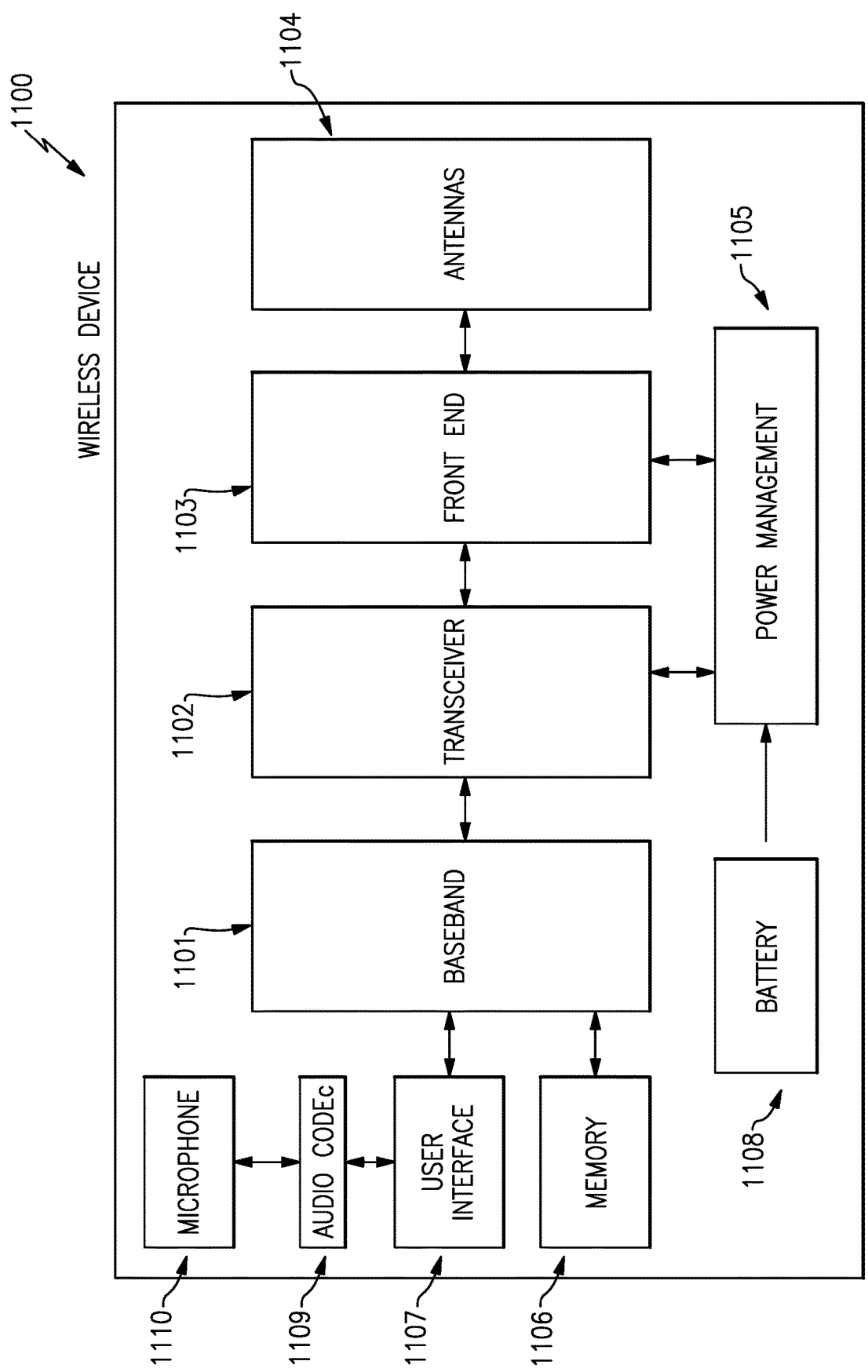
FIG. 11 is a schematic of a wireless device incorporating aspects disclosed herein.

FIG. 11 is a schematic diagram of a wireless device 1100 that can incorporate aspects of the invention. The wireless device 1100 can be, for example but not limited to, a portable telecommunication device such as, a mobile cellular-type telephone. The wireless device 1100 can include a microphone arrangement 1100, and may include one or more of a baseband system 1101, a transceiver 1102, a front end system 1103, one or more antennas 1104, a power management system 1105, a memory 1106, a user interface 1107, a battery 1108, and audio codec 1109. The microphone arrangement may supply signals to the audio codec 109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas. The front end system 1103 aids in conditioning signals transmitted to and/or received from the antennas 1104. The antennas 1104 can include antennas used for a wide variety of types of communications. For example, the antennas 1104 can include antennas 1104 for transmitting and/or receiving signals associated with a wide variety of frequencies and communications standards. The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102.

As shown in FIG. 11, the baseband system 1101 is coupled to the memory 1106 to facilitate operation of the wireless device 1100. The memory 1106 can be used for a wide variety of purposes, such as storing data and/or instructions to facilitate the operation of the wireless device 1100 and/or to provide storage of user information. The power management system 1105 provides a number of power management functions of the wireless device 1100. The power management system 1105 receives a battery voltage from the battery 1108. The battery 1108 can be any suitable battery for use in the wireless device, including, for example, a lithium-ion battery.

The passband filters described herein in accordance with the present invention may be incorporated into the wireless device 1100 of FIG. 11, in particular may be incorporated into the front end system 1103

It should be appreciated that the Lamb wave resonator illustrated in FIG. 1A and the FBAR illustrated in FIG. 1B, along with other structures illustrated in the other figures accompanying this disclosure, are illustrated in a highly simplified form. The relative dimensions of the different features are not shown to scale. Further, embodiments comprising Lamb wave resonators or FBARs may include additional features or layers not illustrated or may lack one or more features or layers illustrated herein.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A passband filter comprising:
a first connection;
a second connection;
a third connection;
a first substrate;
a second substrate;
one or more resonators of a first type connected in series between the first connection and the second connection, the one or more resonators of the first type being disposed on the first substrate; and
one or more resonators of a second type connected from between the first connection and the second connection to the third connection, the one or more resonators of the second type being disposed on the second substrate.

2. The passband filter of claim 1 wherein each of the one or more resonators of the second type are connected in parallel from between the first connection and the second connection to the third connection.

3. The passband filter of claim 2 wherein one of the one or more resonators of the second type is connected to the third connection from between each of the one or more resonators of the first type connected in series.

4. The passband filter of claim 3 comprising n resonators of the second type and n+1 resonators of the first type.

5. The passband filter of claim 1 wherein the third connection is a ground connection.

6. The passband filter of claim 1 wherein each of the one or more resonators of the first type have a smooth frequency response below a resonant frequency of the resonator.

7. The passband filter of claim 6 wherein the one or more resonators of the first type are Lamb wave resonators.

8. The passband filter of claim 1 wherein each of the one or more resonators of the second type have a smooth frequency response above a resonant frequency of the resonator.

9. The passband filter of claim 8 wherein the one or more resonators of the second type are film bulk acoustic wave resonators.

10. The passband filter of claim 1 wherein the first substrate has a first surface, the one or more resonators of the first type being disposed on the first surface, and the second substrate has a second surface, the one or more resonators of the second type being disposed on the second surface, the first substrate and the second substrate being arranged such that the first surface faces the second surface.

11. The passband filter of claim 1 made by forming the one or more resonators of the first type on the first substrate, forming the one or more resonators of the second type on the second substrate, and subsequently either mounting the first substrate onto the second substrate or mounting the second substrate onto the first substrate.

12. The passband filter of claim 1 wherein one or both of the first substrate and the second substrate are silicon wafers.

13. The passband filter of claim 1 wherein the one or more resonators of the first type each have a piezoelectric layer of a first material, and wherein the one or more resonators of the second type each have a piezoelectric layer of a second material, the second material being different from the first material.

14. The passband filter of claim 13 wherein the first material is one of lithium niobate or lithium tantalate.

15. The passband filter of claim 13 wherein the second material is one of aluminum nitride, doped aluminum nitride, or zinc oxide.

16. A radio-frequency module comprising:
a packaging substrate configured to receive a plurality of devices; and
a die mounted on the packaging substrate, the die having a passband filter having a first connection, a second connection, a third connection, a first substrate, a second substrate, one or more resonators of a first type connected in series between the first connection and the second connection, the one or more resonators of the first type being disposed on the first substrate, and one or more resonators of a second type connected from between the first connection and the second connection to the third connection, the one or more resonators of the second type being disposed on the second substrate.

17. A wireless mobile device comprising:
one or more antennas; and
a radio-frequency module that communicates with the one or more antennas, the radio-frequency module having a die including a passband filter having a first connection, a second connection, a third connection, a first substrate, a second substrate, one or more resonators of a first type connected in series between the first connection and the second connection, the one or more resonators of the first type being disposed on the first substrate, and one or more resonators of a second type connected from between the first connection and the second connection to the third connection, the one or more resonators of the second type being disposed on the second substrate.

* * * * *